United States Patent [19]

Balmashnov et al.

[11] Patent Number: 5,336,533
[45] Date of Patent: Aug. 9, 1994

[54] METHOD AND APPARATUS FOR THE PRODUCTION OF A DISSOCIATED ATOMIC PARTICLE FLOW

[75] Inventors: Alexander A. Balmashnov, Moscow,

[73] Assignee: Ruxam, Inc., New York, N.Y.

[21] Appl. No.: 142,248

[22] Filed: Oct. 22, 1993

Related U.S. Application Data

[62] Division of Ser. No. 896,169, Jun. 10, 1992, Pat. No. 5,282,899.

[51] Int. Cl.$^5$ .................... B05D 3/06; B44C 1/22; B23K 9/00
[52] U.S. Cl. .................... 427/562; 427/571; 427/575; 156/643; 156/635; 219/121.59
[58] Field of Search ............ 427/562, 563, 564, 561, 427/575, 571; 156/643, 635; 219/121.41, 121.44, 121.46, 121.59

[56] References Cited

U.S. PATENT DOCUMENTS

| | | | |
|---|---|---|---|
| 4,113,514 | 7/1978 | Pankove et al. | 148/1.5 |
| 4,224,084 | 9/1980 | Pankove | 148/1.5 |
| 4,532,199 | 7/1985 | Meno et al. | 118/723 X |
| 4,609,428 | 9/1986 | Fujimura | 156/643 |
| 4,818,488 | 4/1989 | Jacob | 422/23 |
| 4,891,095 | 1/1990 | Ishida et al. | 156/643 |
| 4,898,118 | 2/1990 | Murakami et al. | 118/723 |
| 4,952,273 | 8/1990 | Popov | 156/643 X |
| 5,038,713 | 8/1991 | Kanakami et al. | 118/723 X |
| 5,196,670 | 3/1993 | Mantei | 219/121.43 |
| 5,203,960 | 4/1993 | Dandl | 156/643 |

OTHER PUBLICATIONS

Popov et al., "Electron Cyclotron Resonance Plasma Stream Source For Plasma Enhanced Chemical Vapor Deposition" *J. Vac. Technol.* A7(3) May/Jun. 1989 pp. 914–917.

Balmashnov et al., "Passivation of GaAs by Atomic Hydrogen Flow Produced by the Crossed Beams Method" *Semicond. Sci. Technol,* 5 (1990) pp. 242–245.

Omeljanovsky et al. "Hydrogen Passivation of Defects and Impurities GaAs and InP" *J. Electronic Materials*, vol. 18, No. 6, 1989 pp. 659–670.

Balmashnov et al. "CERA-C: The System For Hydorgenation of Semi-conductors by the method of Crossed Beams:," Contributed Papers of XX International Conference on phenomena in ionized Bases, Pisa, Italy, Jul. 1991.

Polyakov, et al. "The Effect of Hydrogen On Bulk And Surface Traps In Indium Antimonide", Solid State Communications, vol. 74, No. 8, pp. 711–715 (1990) no month.

Polyakov et al. "Atomic Hydrogen Passivation of Deep Levels Activity In $Al_xGa_{1-x}As$ Multiquantum Well Structures". Solid State Communications vol. 76, No. 6, pp. 761–763 (1990). No month.

(List continued on next page.)

*Primary Examiner*—Marianne Padgett

[57] ABSTRACT

Apparatus and methods for forming a source of dissociated and excited molecules from a working gas-plasma interaction for use in treating substrates such as hydrogen passivation of semiconductors. A plasma is generated under resonant conditions and confined in a reaction chamber by a magnetic mirror trap. The working gas is injected into the reaction chamber to intersect the confined plasma. The interaction forms a neutral species of dissociated and excited molecules and a charged species of ions and electrons. A multipole magnetic field is used to stabilize the plasma and maintain the charged particles of the plasma and the charged species away from the reaction chamber. The charged species is confined to the plasma by the net magnetic field so that the neutral species flows out of the reaction chamber for processing of substrates, e.g., hydrogenation of semiconductor materials. Two sources are used to which produce two axially opposing and aligned electron cyclotron resonance (ECR) plasma streams that meet in a reaction chamber disposed between the two resonators.

OTHER PUBLICATIONS

Pakhomov et al., "Atomic Hydrogen Modification of Polycrystalline Silicon Solor Cells Characteristics", Solid State Communications, vol. 76, No. 7, pp. 887–890 (1990) No month.

Barbour et al. "Silicon Nitride Formation from a Silane–Nitrogen Electron Cyclotron Resonance Plasma", J. Vac. Sci. Technol–A, vol. 9, No. 3, May/Jun. 1991, pp. 480–484.

Know et al. "Characterization of Electronic and Optical Properties of Device Quality a-Si:H and a-(Si,Ge):H grown by remote plasma electron cyclotron Resonance deposition", J. Vac. Sci Technol A, vol. 9, No. 3, May/Jun. 1991 pp. 474–479.

Popov, "Effects of Magnetic Field and Microwave Power on Electron Cyclotron Resonance Type plasma characteristics" J. Vac. Sci. Technol A, vol. 9, No. 3, May/Jun. 1991 pp. 711–716.

Conrad et al., "Plasma source ion-implantation technique for Surface Modification of Materials", J. Appl. Phy., vol. 62, No. 11, Dec. 1, 1987, pp. 4591–4596.

Hirano et al. "Extension of Bearing Endurance Life By Ion Implantation" Appl. Phys. Lett., vol. 49, No. 13, Sep. 29, 1986, pp. 779–781.

Garner et al. "An Inexpensive X-ray Source Based On An Electron Cyclotron" Rev. Sci Instrum. 61(2), Feb. 1990, pp. 724–727.

Brynjolfsson "Factors Influencing Economic Evaluation Of Irradiation Processing" Factors Influencing The Economical Application Of Food Irradiation Symposium Proceeding, Jun. 14–18 1971, 1973, pp. 13–35.

Popov, "An Electron Cyclotron Plasma Stream Source For Low Pressure Thin Film Production" Surface and Coatings Technology, 36 (1988) pp. 917–925.

Popov "Electron Cyclotron Resonance Plasmas Excited By Rectangular and Circular Microwave Modes" J. V. Sci. Technical A 8(3) May/Jun. 1990.

Popov et al., "Electron Cyclotron Resonance Sources For Wide and Narrow Plasma Streams", Rev. Sci. Instrum., 61(1), Jan. 1990 pp. 303–305.

Product Literature for ECR System 9200, Plasma Stream Sources Models 904, 904GR, 906, 906GR, 908. ECR Ion Miller Model 1M601, ECRJr. Research System, Micromagnitrons, Micro 1000 Heater, Researcher 101, ECR Retrofit by Microscience, nine single pages and one tri-fold document. date unknown.

Shapoval et al., "Cubic Boron Nitride Films Deposited by Electron Cyclotron Resonance Plasma" Appl. Phys. Lett. 57(18), Oct. 29, 1990, pp. 1885–1886.

METHOD AND APPARATUS FOR THE PRODUCTION OF A DISSOCIATED ATOMIC PARTICLE FLOW

This is a divisional of copending application Ser. No. 07/896,169 filed on Jun. 10, 1992, now U.S. Pat. No. 5,282,899.

FIELD OF THE INVENTION

This invention relates to a source of dissociated and excited molecules and to an atomic particle passivation processing of solid state materials and devices, more particularly, semiconductor materials and devices.

BACKGROUND OF THE INVENTION

Plasma processing is used for selective etching of solids or for treating solids with excited molecules, atoms, ions, electrons or their compositions to produce certain changes in the surface or near surface regions of the solids. A plasma source is provided for exciting a working gas flow to turn it into an active form. For example, molecules of the working gas are dissociated into atoms or excited to render them efficient in interacting with the solid material. However, in many cases, for example, in treating crystalline semiconductor materials, it is desirable to avoid the bombardment of the substrate surface by ions and electrons contained in plasma because they produce defects in the near surface region of the semiconductor and may lead to degradation of crystal perfection and correspondingly to deterioration of the parameters of semiconductor devices.

Efforts have been made to passirate semiconductor devices by means of a flow of hydrogen gas onto the surface of the semiconductor material. The desired flow consists of hydrogen atoms at a low energy level. Other forms of hydrogen flow, such as a working gas of hydrogen molecules, has no beneficial effect and may have a detrimental effect.

Prior efforts to produce an atomic hydrogen passivation of semiconductor devices are evidenced by U.S. Pat. Nos. 4,113,514 and 4,224,084 which show a glow discharge device to disassociate the atoms of hydrogen molecules, in order to produce atomic hydrogen, but this technique has little practical value. Also, these patents mention, but do not illustrate, thermal dissociation of $H_2$ to form atomic hydrogen, as well as electron bombardment of $H_2$.

In producing atomic hydrogen by dissociation of hydrogen molecules, it is important to (1) achieve a high proportion of atomic hydrogen, as compared with molecular hydrogen, in the resulting particle flow used for passivation, (2) eliminate from the resulting particle flow any ions or electrons that may be produced in the dissociation process, and (3) achieve a high density particle flow, as well as a large area flow, so that large areas of semiconductor material may be passivated at a time.

Another effort to produce an atomic hydrogen passivation of semiconductor devices is evidenced by Omeljanovsky et al., "Hydrogen Passivation of Defects and Impurities in GaAs and InP", *Journal of Electron Materials*, Vol 18, No 6, 1989, pp. 659–70. This article refers to igniting a plasma within a resonant cavity and confining the plasma in a beam extending through an aperture in and into a stainless steel tube by a magnetic field produced by an electromagnet and solenoids. A hydrogen working gas flow at supersonic speeds crosses the plasma beam. This crossing results in the hydrogen molecules dissociation and partial ionization of formed hydrogen atoms. Charged particles are deviated by the magnetic field, while atomic hydrogen keep moving forward and hit the substrate within the tube. However, the result does not reach a desireable level of efficiency in plasma processing of substrates, and is limited to an atomic hydrogen flow of about $3 \times 10^{17}$ atoms $s^{-1}$.

There is thus a continuing need to develop improved devices and methods for plasma processing of substrates, particularly for providing a neutral, atomic flux for treating semiconductor substrates.

SUMMARY OF THE INVENTION

It is, therefore, an object of the present invention to provide an improved source of a dissociated and excited molecule flux at a suitably high concentration with a minimum of charged particles for treating substrates. It is another object to provide such a source for treating substrates having relatively large surface areas.

It is another object of the present invention to provide a source for atomic passivation treatment of solid state semiconductor materials and devices, in particular hydrogen passivation.

It is another object of the present invention to produce a plasma that is mostly stable in its macroscopic aspect. It is another object to reduce the losses of charged particles through contact with the reaction chamber walls.

In accordance with the present invention, methods and apparatus are provided for producing a dissociated and excited molecule flux, i.e., a neutral atomic and excited molecule particle flow, for treatment of substrates such as semiconductor materials and devices.

One aspect of the invention concerns providing a dissociated and excited molecule flux. A plasma is ignited in a plasma discharge chamber under conditions close to electron cyclotron resonance (ECR) to produce high concentrations of ionized particles. A first magnetic field is used to form a magnetic mirror trap to confine and to guide longitudinally the plasma, along a first axis inside a reaction chamber, at a sufficiently high density. A second magnetic field, formed by a multipole magnetic system, is used to stabilize magnetohydrodynamically the confined plasma in an interaction area of the reaction chamber, and maintain it away from the reaction chamber walls.

A molecular working gas, electrically neutral, is injected into the interaction area of the reaction chamber, at supersonic speed, to cross the plasma confined in the magnetic trap. The working gas is preferably directed perpendicular to the magnetic field confining the plasma. The gas flows into and interacts with the confined plasma and becomes activated, i.e., the molecules are dissociated into atoms, transferred into an excited form or ionized. The charged species, i.e., the ions and electrons, remain in the reaction chamber, held by the net magnetic field confining and stabilizing the plasma. The neutral species flux, i.e., the dissociated atomic material and excited molecules (and any excited, but not ionized, atomic matter), then flow out of reaction chamber, through an outlet aperture. This flux (also referred to as a particle flow) then can be applied to treat (i.e., irradiate) a substrate.

In accordance with a preferred embodiment of the present invention, a source of neutral species particle flow includes a reaction chamber that is located between two resonant cavities, each of which contains a plasma discharge chamber and generates a plasma stream. The plasma streams are oppositely directed. They combine in the interaction area of the reaction chamber and fill the compact magnetic mirror trap that is supplemented by the multipole magnetic field.

In accordance with another preferred embodiment, the reaction chamber is located between two oppositely directed ECR plasma sources that respectively produce plasma streams that are oppositely directed on the common axis. The two ECR plasma sources are preferably identical.

The disassociation process of the present invention, when applied to a neutral molecular hydrogen working gas, produces hydrogen ions and electrons, atomic and molecular hydrogen that is at a normal stable energy state, and atomic and molecular hydrogen that is at an excited, but not ionized, state. Magnetic fields are used to constrain the ions and electrons, but the other neutral particles pass through an output port to form a source of passivating particle flow.

Advantageously, the present invention produces a high percentage of atomic hydrogen (approximating 80%), a high density particle flow (approximating $2 \times 10^{17}$ s$^{-1}$), and a large cross-section flow area (approximating 10 cm$^2$ at the output port, and 1000 cm$^2$ at the surface of the substrate, i.e., the object of treatment, which could be, for example, a wafer of semiconductor material, an spitaxial structure, or a completed semiconductor device).

The source is operated at very low pressure. For treating a substrate, the source is preferably coupled to a flow expanding structure that connects the neutral species outlet of the source with a treatment chamber for containing the substrate. The flow expanding structure is provided to expand the cross-sectional area of the flow as it exits the source and passes to the substrate. Preferably the flow expanding structure has a conical or frusto-conical shape.

An evacuation pump is provided to evacuate partially the plasma discharge and reaction chamber(s), the flow expanding structure, and the treatment chamber, and for controlling the relative operating pressure in the reaction chamber and the treatment chamber. In this regard, there is a pressure gradient such that the pressure is lower in the location of the substrate to be treated than at the plasma discharge chambers. The gradient is preferably one to two orders of magnitude. This permits increasing the area of the neutral species gas flow and facilitates both plasma discharge and irradiation of the substrate with a sufficiently high flux density, e.g., for hydrogen passivation. Thus, the source, the shaped structure, the treatment chamber and the pump form a device for exposing substrates to the dissociated and excited molecule flow for altering the characteristics of the substrate. The invention includes controlling the partial pressure, net magnetic field profile, and plasma discharge conditions to control the neutral species flow and the conditions of irradiating the substrate with the neutral species.

The net magnetic field is preferably comprised of two superimposed magnetic fields, a first magnetic field and a multipolar magnetic field. The first field is formed by magnetic devices, e.g., electromagnets, solenoids or permanent magnets, that are placed about the common axis proximate to the plasma discharge chambers, and generally symmetrically spaced about the reaction chamber. The magnetic devices produce a magnetic field vector parallel to the common axis, preferably axisymetric to the axis.

The magnetic field intensity profile is adjustable to a first profile for initial ignition of the plasma and to a second profile for maintenance of the plasma discharge. Thus, the plasma is ignited by a suitable energy source appropriately coupled to each resonant cavity preferably an Ultra High Frequency (UHF) magnetton, in the presence of a magnetic field strength that is at or near ECR conditions at the selected excitation frequency. The preferred axisymetric magnetic field also forms an adjustable compact magnetic mirror trap that is filled by the plasma streams and the charged species of the activated working gas in the reaction chamber.

In a preferred embodiment, the axisymetric magnetic field system is formed by two main solenoids, spaced apart on opposite sides of the reaction chamber, and two optimizing solenoids spaced on opposite sides of the reaction chamber and between the two main solenoids. The axes of the solenoids are aligned with the common axis. The main and optimizing solenoids may be separately and asymmetrically energized and located to provide the optimum magnetic field profile during both initial and continued plasma discharge operations. For example, the midplane of the main solenoids (perpendicular to the axis) may be situated in about the same plane as the outward ends of the resonant cavities with the inner plane of the optimizing solenoids situated in about the same plane as the walls of the reaction chamber.

The multipolar magnetic field provides a magnetic multipole to stabilize and confine the plasma in the reaction chamber, and in particular the interaction area where the opposing plasma and streams the working gas flow intersect, and to decrease the loss of charged particles as a result of contact with the walls of the reaction or discharge chambers. The magnetic multipole surrounds the reaction chamber and preferably is a set of magnetic elements, such as permanently magnetized bars forming a quadripole.

Advantageously, in the present invention, the reaction chamber is situated out of the resonant cavities and does not influence the resonant conditions of plasma formation. Therefore, the outlet aperture of the reaction chamber can be made as large as necessary to increase the diameter of the flux and, hence, the area of the samples that can be treated by the neutral species flux, without any loss of efficiency of the production of the neutral species, i.e., the excited and dissociated molecules produced by the working gas-plasma interaction. Moreover, by controlling the pressure and using the conical-shaped flow expanding structure, the neutral species gas flow can be provided with a sufficiently large cross-sectional area at a high enough density to treat economically and efficiently large surface area substrates.

Another advantage of the present invention is that the use of the combined magnetic fields of the solenoids and the multipole provides improved plasma confinement, i.e., it reduces particle loss and therefore requires less microwave energy to maintain the plasma.

Yet another advantage of the present invention is that the plasma in the reaction chamber is not flowing, in contrast to the above cited references. This also reduces the amount of microwave energy required to obtain higher densities.

BRIEF DESCRIPTION OF THE DRAWINGS

Further features of the invention, its nature and various advantages will be more apparent from the accompanying drawings and the following detailed description of the invention, in which like reference numerals refer to the like elements and in which.

DETAILED DESCRIPTION OF THE INVENTION

Figure 1:
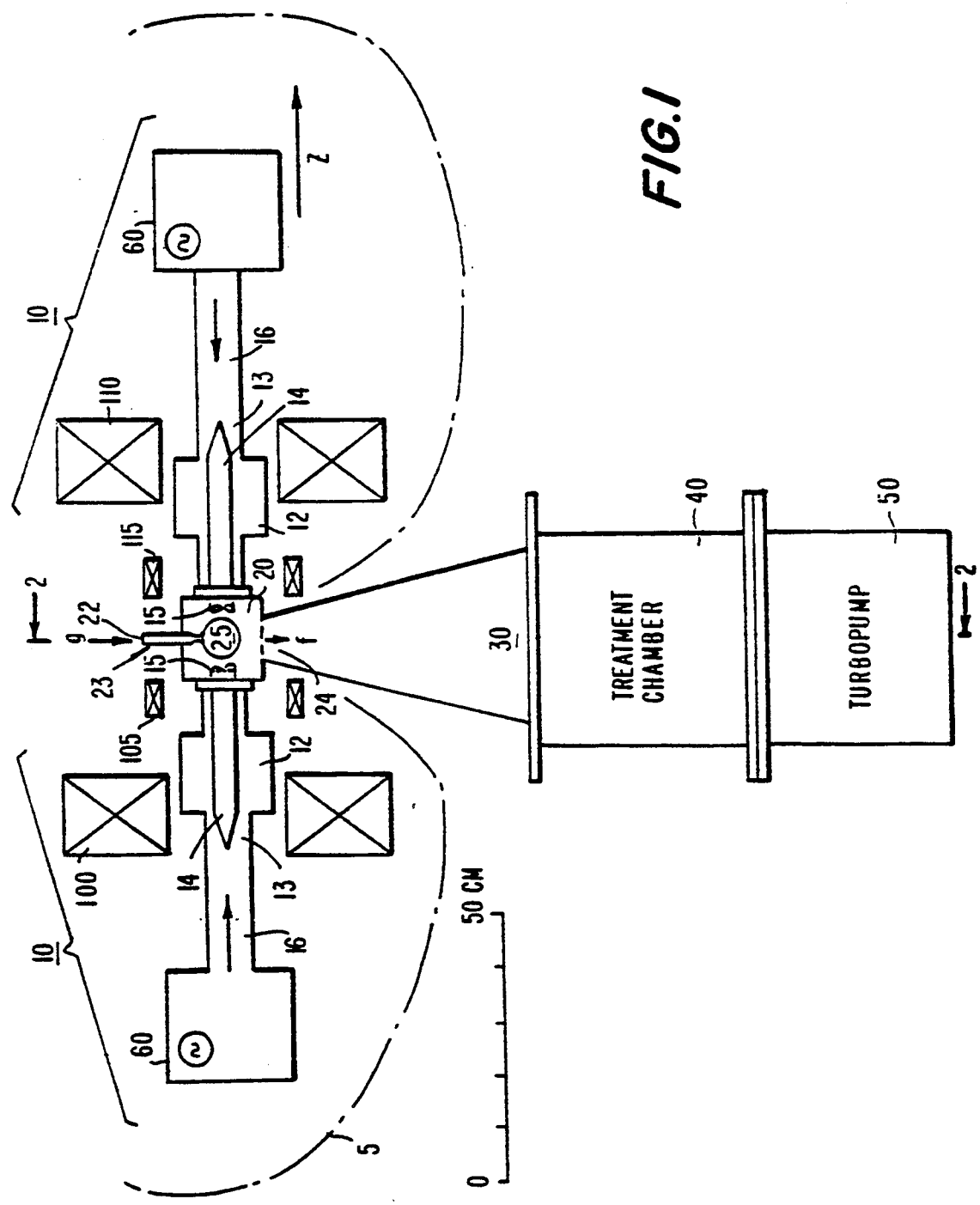
FIG. 1 is a front cross-sectional view of a preferred embodiment of the present invention taken along a vertical plane.
Figure 2:
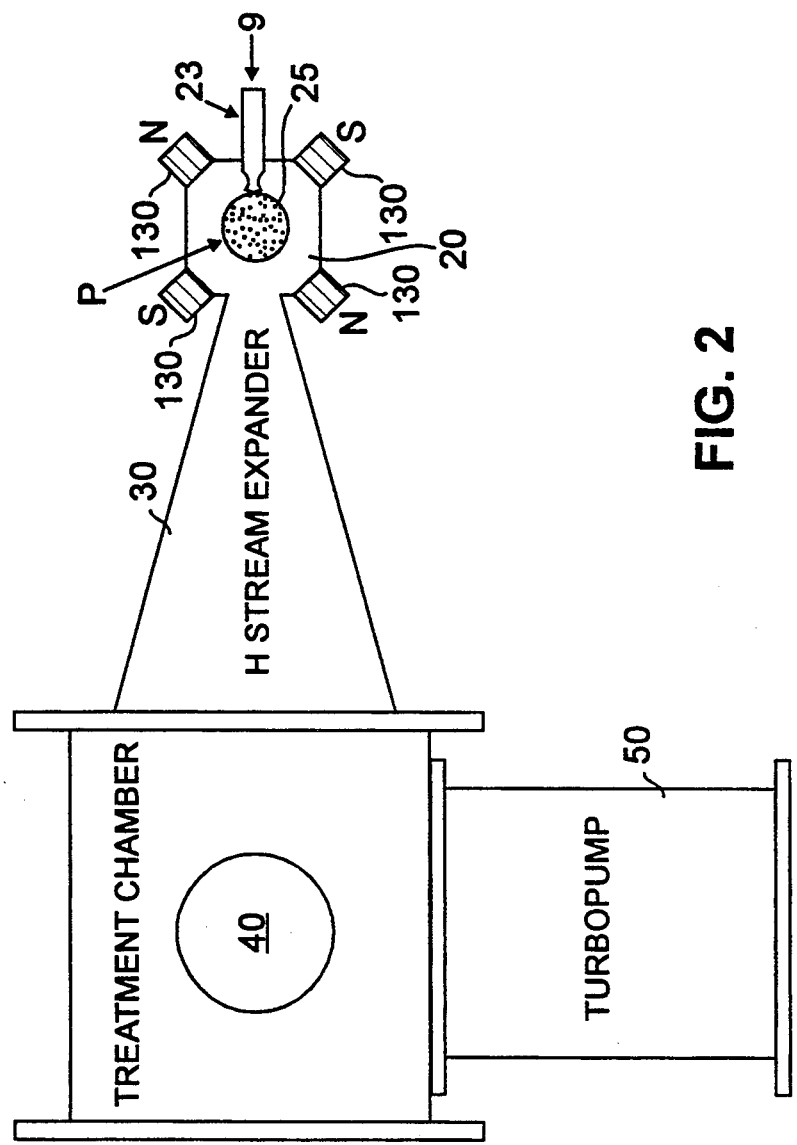
FIG. 2 is a partial side cross-sectional view taken along lines 2—2 of FIG. 1.
Figure 5:
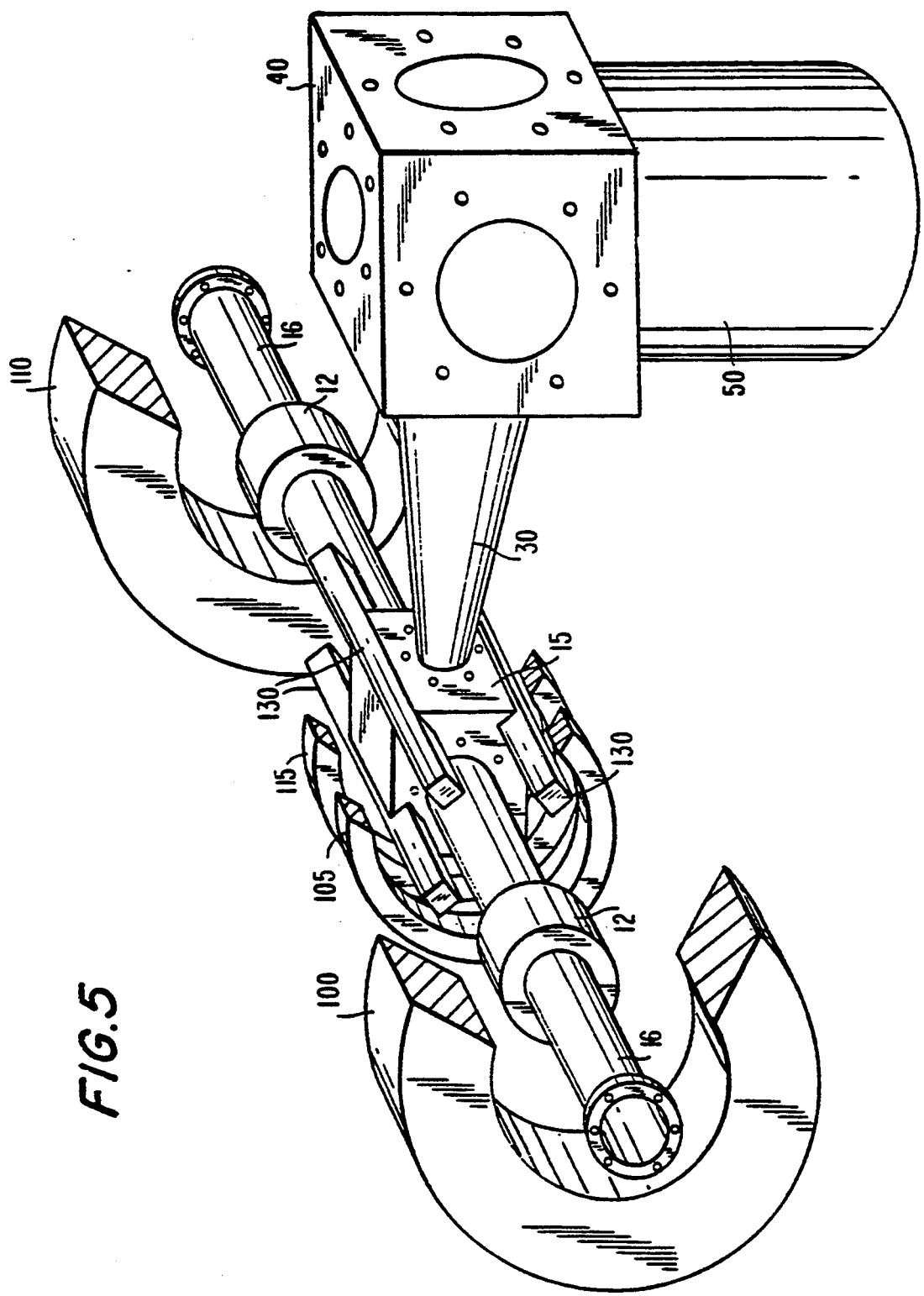
FIG. 5 is an isometric view of the device of FIG. 1.

FIGS. 1, 2, and 5 show an apparatus for treating substrates with a flow of dissociated atomic and excited atomic and molecular particle flux, in accordance with a preferred embodiment of the invention. In this embodiment, the apparatus includes a source 5 of dissociated atomic and excited atomic and molecular particles, a flow expanding structure 30, a treatment chamber 40 and a pump 50.

Source 5 comprises two identical plasma sources 10 on opposite sides of a reaction chamber 20. The plasma sources 10 produce two oppositely directed plasma streams which combine and maintain a dense plasma in an interaction area, generally illustrated as area 25, of reaction chamber 20. The plasma is confined in a magnetic mirror trap formed by solenoids 100, 105, 110 and 115. The two plasma sources 10 and reaction chamber 20 are preferably in alignment on a common axis.

The reaction chamber 20 encloses a volume including area 25 and has an inlet 22 for a working gas flow g and an outlet 24 for the neutral species flow f. Area 25 is where the working gas g, which flows from the inlet 22 toward the outlet 24, intersects and interacts with the accumulated plasma p, and undergoes dissociation, excitation and ionization. Reaction chamber 20 also is known as the dissociation chamber.

Each plasma source 10 includes a resonant cavity 12 and a plasma discharge chamber 14. A waveguide 16 is provided to pass UHF energy from a microwave power supply source 60, such as, for example, a conventional magnetton, into each resonant cavity 12. Waveguides 16 are shown axially aligned on the common axis and opening into the flat end wall of the resonant cavities 12, but other cavity excitation configurations may be used. Each resonant cavity 12 is configured to resonate with a mode of oscillation wherein the electric field vector is perpendicular to the common axis of the two cavities 12.

In the preferred embodiment, cavity 12 is cylindrical and resonates in the $TE_{111}$ mode. A preferred UHF excitation frequency is in the microwave range, at 2.45 GHz. Preferably, waveguide 16 is a circular waveguide and may include a rectangular mode to circular mode transition. Suitable power levels are on the order of 0.1 to 1.0 kW for each cavity. Each waveguide 16 may be excited by the microwave oscillator in a linear mode or a right hand polarized mode; preferably both cavities 12 are excited in the same mode. Resonant cavities 12 and waveguides 16 are preferably made of a conventional conductive material, e.g., copper, brass, aluminum or like material. A single UHF power supply and a suitable waveguide network for distributing sufficient power to waveguides 16 may be used in place of one UHF power supply for each resonant cavity 12.

Plasma discharge chambers 14 are used for igniting and maintaining a plasma discharge under Electron Cyclotron Resonance (ECR) conditions. Each chamber 14 is made of a dielectric material, preferably quartz or quartz glass, to be transparent to the UHF, e.g., microwave, energy. Each chamber 14 is preferably formed as a cylindrical tube having an open end 15 and a closed end 13. The open end 15 produces the plasma stream. The closed end 13 preferably has a contoured shape to facilitate coupling of microwave energy from the waveguide 16 to cavity 12, whereby the cylinder diameter decreases to a point at the end. Preferably, the contoured shape is a conical shape.

In the embodiment shown, each of source 10, waveguide 16, cavity 12, and plasma discharge chamber 14 are axially aligned along and about a common axis. Non symmetrical and non axially aligned structures also may be used, provided that adjustments are made in the magnetic fields so that the desired dense plasma is maintained in a stable manner in area 25 for the purposes described herein.

The open ends 15 of the plasma forming chambers 14 extend and open into reaction chamber 20, in opposition, so that the oppositely directed plasma streams exit the open ends and meet in the middle. The working gas flow g thus interacts with the accumulated plasma p in area 25 in the middle of reaction chamber 20.

Both plasma sources 10 and reaction chamber 20 are essentially disposed within a magnetic field that maintains the plasma streams at a suitable density to cause dissociation and excitation of the working gas molecules upon interaction. The net magnetic field is preferably comprised of an axisymetric magnetic field and a multipole magnetic field. The axisymetric magnetic field provides a magnetic mirror trap having a magnetic profile that is initially established to facilitate creation of the plasma at the start of operation. The net magnetic field profile is then preferably adjusted during operation so that the magnetic profile is tuned for optimal operation. More specifically, the magnetic field profile is adjusted so that the value of the magnetic field strength inside each cavity 12 during the start-up of operation can be varied around the ECR value for the UHF-microwave frequency used. After start-up, the magnetic profile is optimized to obtain the optimal conditions of operation.

Referring to FIG. 1, in a preferred embodiment the axisymetric magnetic field is generated by two main magnetic devices 100 and 110 and two optimizing magnetic devices 105 and 115. The magnetic devices may be an electromagnet, a permanent magnet or a solenoids, in any combination. Preferably, each magnetic device is a solenoid, and is hereafter referred to as a solenoid.

Main solenoids 100 and 110 provide an axially symmetric magnetic mirror trap with the mirror ratio being in the range of 1.2 to 5.0, more preferably between 2 and 4. The optimizing solenoids 105 and 115 are used to optimize the magnetic field |B| profile of the mirror trap. The solenoids 100, 105, 110 and 115 are positioned along and in axial alignment with the common axis of resonant cavities 12. They are relatively spaced apart to provide a magnetic field strength in the midplane of each resonant cavity 12 that would be equal during the start-up to the ECR value for the selected microwave frequency. For example, for a frequency of 2.45 GHz, the magnetic field strength for the ECR value is 875 gauss. The initial magnetic profile is provided with a field strength in each of the cavities 12, on the side oriented toward waveguide 16, that is higher than the ECR value, and a field strength on the side oriented toward the reaction chamber 20 is less than the ECR value. During operation, the optimizing solenoids 105 and 115 may be physically and/or electrically adjusted to adjust the magnetic field |B| profile to obtain the best condition of operation, namely, the creation and the contained maintenance of a stable, confined plasma beam. The main solenoids 100 and 110 also are to be similarly adjusted.

In a preferred embodiment, the main solenoids 100 and 110 35 are identical and are made of water cooled copper wire and produce a field strength of the order of from 0 to 0.3 Tesla, preferably 0.2 Tesla in their central planes, and optimizing solenoids 105 and 115 are made of water cooled copper wire and produce a field strength on the order of from 0 to 0.05 Tesla, preferably 0.03 Tesla in their central planes. The dimensions and spacing of solenoids 100, 105, 110, and 115 are to the scale indicated in FIG. 1. For example, solenoids 100, 105, 110 and 115 may be made of an 8×8 mm copper conductor having a 4 mm inner diameter for cooling water. Solenoids 100 and 110 each have 44 turns having an inner diameter of 250 mm, an outer diameter of 360 mm and a length of 80 mm. Solenoids 105 and 115 each have 11 turns having an inner diameter of 250 mm, an outer diameter of 360 mm and a length of 20 mm. The distances between the central planes of solenoids 100 and 110 and the central plane of the whole apparatus are ±300 mm. Solenoids 100 and 110 are connected in series and at startup, require 17.8 volts and 600 amps. The distance between the central planes of solenoids 105 and 115 and the central plane of the whole apparatus are ±65 mm. Solenoids 105 and 115 are connected in series and at start-up require 4.4 volts and 600 amps. Typically, optimizing operation after start-up resulted in reducing the coil current from 600 amps to about 400 amps.

Referring to FIG. 2, the multipolar magnetic field produces a magnetic field that is perpendicular to the common axis to improve the magnetohydrodynamic stability of the plasma, particularly in area 25 of the reaction chamber 20 where the plasma streams combine and are not confined by the dielectric discharge chamber tubes 14, and where the axial magnetic field lines curvature is not favorable. Preferably, the multipolar magnetic field is produced by a plurality of magnetic elements 130 that are spaced around the common axis in the reaction chamber 20, and preferably fixed on the exterior of the reaction chamber 20 enclosure.

The plurality of magnetic elements 130 is an even number of uniform magnetic elements that are uniformly spaced with alternating north-south polarity. A typical number of magnetic elements is four, and each magnetic element is preferably a permanently magnetized bar having the same magnetic field strength on the surface of 0.2 Tesla to 0.4 Tesla, preferably 0.3 Tesla. The polarity of the quadripole is illustrated in FIG. 2, where N represents the North pole and S represents the South pole.

Solenoids 100, 105, 110, and 115 form a magnetic mirror trap having a vector on its axis aligned with the common axis of discharge chambers 14. The plasma streams will then flow from each of the discharge chambers 14 along the magnetic field lines into reaction chamber 20, where they combine and are confined by the net magnetic field produced by solenoids 100, 105, 110, 115 and the four magnetized bars 130.

Figure 3:
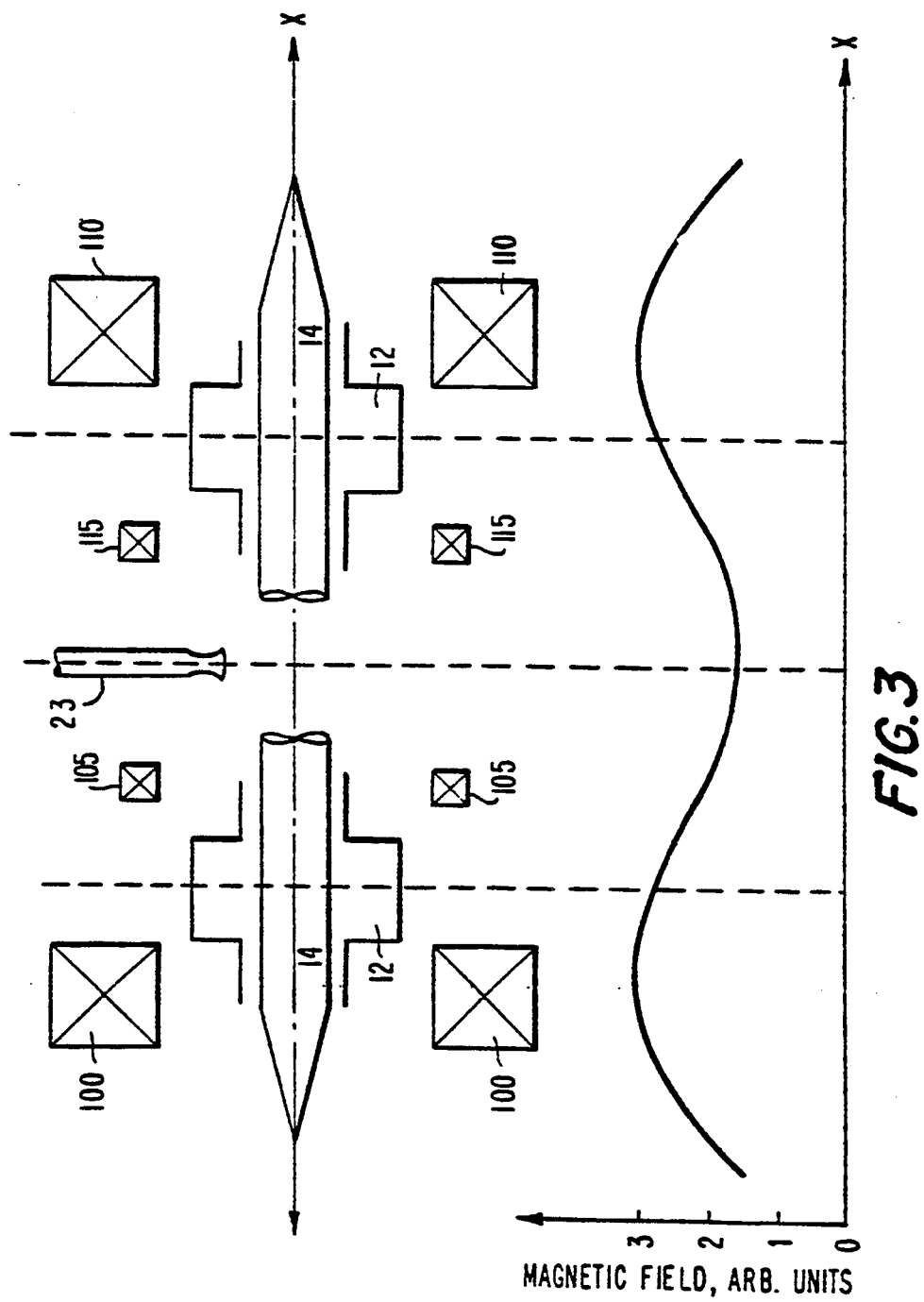
FIG. 3 is a plot of a representative net magnetic field {B{ profile versus the common axis Z of the device of FIG. 1.

The relative magnetic field strength between the opposing plasma discharge chambers 14, corresponding to an operational mode of the plasma sources, is illustrated in FIG. 3. In the area of reaction chamber 20 where the plasma streams are not confined by the dielectric tubes, the magnetic field profile is in a conventional mirror trap configuration which confines the plasma in the longitudinal direction.

Figure 4:
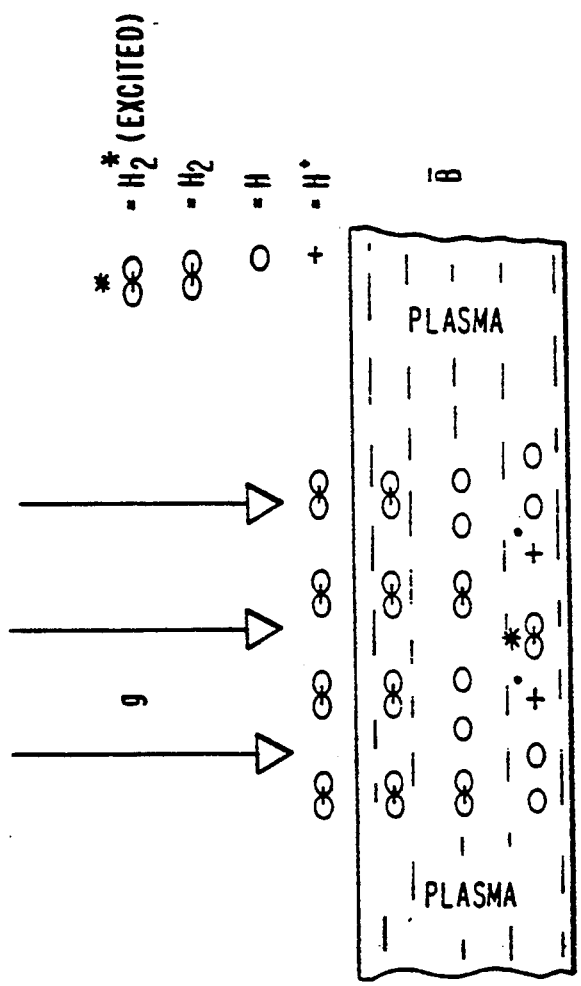
FIG. 4 is a schematic diagram of the working gas plasma interaction of the embodiment of FIG. 1.
Figure 4:
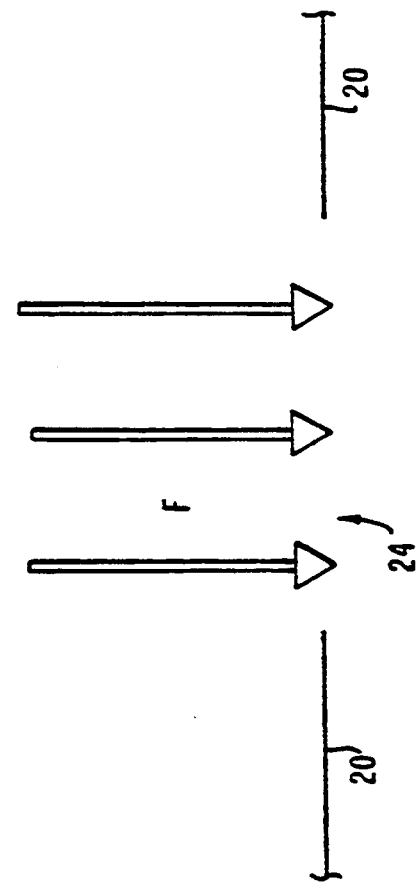

Referring to FIGS. 1, 2 and 4, reaction chamber 20 is where the flow of the molecular working gas g, e.g., hydrogen ($H_2$), represented in FIG. 4 by solid arrows, is injected into area 25. The molecules, represented in FIG. 4 by a pair of ovals connected by a line, intersect the region of the plasma p, represented in FIG. 4 by dashed horizontal lines, in a direction that is practically perpendicular to the net magnetic field B. The density of the combined plasma streams has enough hot electrons to dissociate partially (or excite vibrationally) and ionize partially the molecular gas flow. Under electron bombardment in the plasma p, the $H_2$ molecules partially ionize to $H^+ + e^-$, partially transfer into an excited state $H_2^*$, represented in FIG. 4 by a pair of ovals under an asterisk, and dissociate into neutral atomic matter H, represented in FIG. 4 by a single oval, and perhaps an excited atomic matter $H^*$ (not shown). The charged species, i.e., the ions $H^+$ and electrons $e^-$, created in this process, electrons are represented in FIG. 4 by dots and ions are represented in FIG. 4 by plus signs, are confined in the magnetic mirror trap by the net magnetic field B, and thus do not reach gas outlet 24 in a significant or deleterious amount. The neutral species f, i.e., dissociated atoms H and excited atoms, radicals and molecules $H^*$ and $H_2^*$, created in this process, represented in FIG. 4 by double arrows, are not influenced by the net magnetic field B and thus move in the direction of flow through outlet 24 into flow expander 30.

Reaction chamber 20 is preferably a stainless steel box having four openings. Two of the openings are in opposite sides of the box and respectively receive the open ends 15 of the opposing plasma discharge chambers 14. The ends 15 form a vacuum tight seal for partial evacuation of reaction chamber 20 and plasma discharge chambers 14, as described below.

The other two openings are used to form the gas flow path through reaction chamber 20 and area 25. Thus, one opening is the gas inlet 22, which receives a nozzle, preferably a Laval nozzle, which is shown schematically in FIG. 1 as item 23. The nozzle 23 receives the working gas flow g and, in a conventional manner, accelerates the gas flow g to supersonic speeds. Preferably the gas flow g is injected into nozzle 23 at ultrasonic speeds. The other opening is the gas flow outlet 24 which is mated to the flow expander 30.

Flow expander 30 connects outlet aperture 24 to the treatment chamber 40. It has dimensions that do not interfere with the neutral species flow as the flow expands with the distance traveled from aperture 24. Preferably, expander 30 is a conical section (a frusto-conical structure) made of stainless steel.

Treatment chamber 40, also preferably made of a stainless steel housing, is where the substrate to be irradiated with the neutral species flow is positioned for treatment. Treatment chamber 40 may be a conventional unit which contains the necessary mechanical and temperature regulating elements for monitoring and maintaining the substrate in the correct physical and thermal condition for the chosen irradiation procedure, and for treating successive substrates in either a batch or continuously advancing process.

A pump 50 is provided to evacuate partially plasma discharge chambers 14, reaction chamber 20, flow expander 30 and treatment chamber 40. Pump 50 is preferably located proximate to treatment chamber 40 so that the highest possible vacuum may be maintained near the substrate to be treated. Preferably, the pressure at the substrate is on the order of $10^{-6}$ Torrs and the pressure in each of the dielectric plasma discharge chambers 14 is on the order of $10^{-4}$ Torrs. The latter pressure is optimal to sustain an adequately dense plasma. Pump 50 may be an oil free pump, preferably a conventional turbomolecular pump, commonly used in semiconductor processing, having a pumping capacity on the order of 1500 L/sec.

The density of the resultant dissociated molecules flow can be estimated using the following relation:

$$\Sigma = (1/3) \, L <\sigma v> n_e n_m$$

where L is the distance travelled by the neutral molecules inside the plasma (the effective diameter of the plasma); $<\sigma v>$ is the probability of dissociation averaged upon the Maxwellian distribution of electrons, and $n_e$ and $n_m$ are respectively the densities of electrons and molecules. For the electron temperatures $T_e$ being from 20 to 40 eV, which is suitable for vibrational excitation and dissociation of hydrogen (and some other molecules), the value of $<\sigma v>$ would be $9 \times 10^{-9}$ cm$^3$s$^{-1}$ (see, e.g., *Sov. Physic of Plasma*, 1981, 7, pp. 592–597). Then, to obtain a flow of dissociated molecules of hydrogen with a density of $10^{18}$ cm$^{-2}$s$^{-1}$ (equivalent to the current density of $1.6 \times 10^{-1}$ Acm$^{-2}$) with $n_e$ being typically on the order of $10^{12}$ cm$^{-3}$ and $n_m$ being on the order of $10^{14}$ cm$^{-3}$, the effective diameter of the plasma should be no less than 3.3 cm. Typically, the effective diameter of the plasma is between 5 and 6 cm.

EXAMPLES

A source of neutral species flow in accordance with the apparatus illustrated in FIGS. 1–5 was constructed and operated as follows. Two resonant cavities 12 were constructed of copper (aluminum could be used) as cylinders having a diameter of 130 mm, and a width along the common axis (i.e., in the longitudinal direction in FIG. 1) of 82 mm. Each cavity 12 was energized with 0.5 kW of microwave energy at 2.45 GHz in a continuous wave (CW) mode and produced rotating right-hand or linearly polarized oscillations in the TE$_{111}$ mode (in the absence of the plasma), The main solenoids 100 and 110 each had 44 turns of a $8 \times 8$ mm$^2$ copper wire forming an annular structure with a rectangular cross-section having a width of 80 mm along the common axis, the outer diameter of the annulus was 360 mm, and the inner diameter of the annulus was 250 mm. Solenoids 105 and 115 each had 20 turns of a $8 \times 8$ mm$^2$ copper wire forming an annular structure with a rectangular cross-section having a width along the common axis of 20 mm, the outer diameter of the annulus was 360 mm, and the inner diameter of the annulus was 250 mm. The copper wire contains a 4.0 mm inner diameter channel for a coolant. The solenoids may be connected electrically in parallel or serially and in this example were connected serially. The power supply is preferably a 22.2 volt DC power supply providing a current of 600 amps having pulsations of 1% or less, which depends on its characteristics.

The multipole magnetic field was produced by a system of a quadripole comprising four permanently magnetized bars 130. Each bar 130 was made of a SmCo$_6$ material and had the same dimensions of $15 \times 20 \times 240$ mm$^3$ and magnetic field strength on the pole of 0.3 Tesla. The bars 130 were longitudinally aligned with the common axis and equidistantly spaced around reaction chamber 20 with alternating north-south polarity (see FIG. 2) and a distance of 80 mm between opposite magnets 130.

Plasma discharge chambers 14 were each made of a quartz tubing having an inner diameter of 56 mm, an outer diameter of 60 mm, and a length of 300 mm. The conical tip at ends 13 each had a solid angle of 30° and a projection of 120 mm along the common axis. The base of the conical sections were respectively aligned with the outer flanges of the cavity. The distance between the midplanes of resonant cavities 12 was 650 mm. Reaction chamber 20 was a cube having dimensions of $150 \times 150 \times 150$ mm$^3$. The open ends 15 of tubes 14 extended inside reaction chamber 20 by 25 mm and were separated by a distance of 100 mm.

Working gas inlet 22 and active particles outlet 24 were oppositely aligned in reaction chamber 20. Working gas inlet 22 had a diameter of 2 mm, preferably having, or being configured to perform as, a Laval nozzle 23. Gas outlet 24 had a diameter of 30 mm. The flow expander 30 was a frusto-conical structure having an inlet diameter of 30 mm at its narrow end and an outlet diameter of 300 mm at the end mated to treatment chamber 40, and a height of 50 cm along its axis. The diameter of the resultant active particle flow f at a distance of 20 cm from the common axis in the area 25 was 120 mm.

Treatment chamber 40 was made of a stainless steel cube having 400 mm sides. The sample holder (not shown) could be located anywhere on the axis of the flow expander. The sample holder may be a quartz table equipped with a conventional heater and thermocouple for temperature control during treatment.

The foregoing device was operated as follows. First, pump 50 was operated to evacuate the apparatus 5 down to a pressure not higher than $10^{-5}$ Torr, preferably to about $10^{-6}$ Torr.

Second, the working gas g was fed into the system up to a suitable operating pressure. The working gas disperses into the plasma discharge chambers and is the plasma supporting gas. The range of pressures in the reaction chamber was maintained between $10^{-4}$ and $10^{-6}$ Tort. The working gas g feed was maintained in the range of $5 \times 10^{-4}$ gs$^{-1}$ or less. In this example, the working gas g was hydrogen and the operating pressure was in the range of from $1 \times 10^{-4}$ to $8 \times 10^{-4}$ Torr.

Third, power was supplied to solenoids 100, 105, 110, and 115 and the net magnetic field profile was adjusted to provide resonant conditions in plasma chambers 14 suitable for igniting the plasma. The preferred start-up conditions are close to the electron cyclotron resonance inside both cavities 12.

Fourth, UHF-power of 0.2 kW was applied to each of resonant cavities 12 to provide an ultra high frequency electromagnetic field oscillating in the TE$_{111}$ mode (in the absence of the plasma), thereby to ignite the plasma.

At the moment of plasma ignition, the magnetic field in the middle planes of each resonant cavity 12 was close to 0.87 kG (ECR condition for a frequency of 2.4 GHz) and the ratio of the magnetic field at the edge of cavity 12 to the magnetic field in the center of cavities 12 (the mirror ratio) was 1.8.

Fifth, the operating value of the net magnetic field in the working gas g - plasma p area 25 was adjusted. In the operating mode in each of solenoids 100, 105, 110, and 115, the current was adjusted to achieve the desired net magnetic field intensity level profile. This resulted in a plasma beam p in area 25 of reaction chamber 20 having a stream diameter of 55 mm, a density of $1 \times 10^{12}$ cm$^{-3}$, and electron temperature $T_e = 30$ eV. The dynamic pressure of the working gas g in reaction chamber 25 (in this case, hydrogen) was $1 \times 10^{-4}$ Torr.

In the present example, the operating values of magnetic fields were selected from among the range of from 0.5 to 0.7 $B_{ECR}$, where $B_{ECR}$ is the magnetic field value corresponding to the electron cyclotron resonance in the midplane of resonant cavity 12. It should be understood, however, that in the general case the operating magnetic field values could be lower, higher or equal to the ECR value. The values of the operating magnetic fields are controlled by the gas pressure in chambers 14, the working gas type, and the value (magnitude) of applied UHF-power. The magnetic field values are controlled by the current levels in the optimizing solenoid 105 and 115, as well as in the main solenoids 100 and 110, and their respective spacings.

Under the foregoing conditions, the following results were achieved. The density (or flow density) of atomic hydrogen at the plane of outlet 24 near the wall of the reaction chamber 20 was $3 \times 10^{18}$ cm$^{-2}$s$^{-1}$ (diameter 30 mm). At a distance of 20 cm from the common axis of reaction chamber 20, the density was $2 \times 10^{17}$ cm$^{-2}$s$^{-1}$ with the diameter of the active particle flow being 120 mm. Thus, the density of activated particles was as large as the one described in Balmashnov et al, "Passivation of GaAs by Atomic Hydrogen Flow Produced by the Crossed Beam Method" *Semiconductors Science and Technology*, 1990, 5, pp. 242-245, whereas the diameter of the active particle flow was 12 times larger. Accordingly, the present invention apparatus and methods are capable of passivating surfaces that are two orders of magnitude larger than the source described by Balmashnov et al.

The above described plasma source was separately used to provide a flow (or flux) of low-energy dissociated atomic hydrogen and excited hydrogen molecules through outlet 24 at the above noted densities for hydrogenation treatment of various substrates, including several sets of the following semiconductor devices: polysilicon solar cells, n-InSb MIS-capacitors, AlGaAs multiquantum well diodes and n-GaAs, n-InP based Schottky diodes. The upper temperature limits of the substrate during the flux treatments varied from 150° C. for InSb to 450° C. for others. The exposure times did not exceed 15 minutes. During the treatment, substrate was installed on a sample holder (not shown) in treatment chamber 40 and treated as is, including any metallic contacting networks on the substrate surface.

The placement of the substrate onto the sample holder can be done manually or automatically in a batch mode or in a continuous mode whereby substrates are advanced and conveyed, continuously or intermittently, through the treatment chamber 40. The operating pressure range in the reaction chamber 20 is maintained from 2 to $5 \times 10^{-4}$ Torr, preferably $4 \times 10^{-4}$ Torr. For treatment of semiconductor wafers of a relatively large surface area, e.g., on the order of $10 \times 10$ cm$^2$ and larger, an appropriate distance between outlet 24 and the substrate holder is generally believed to be about 500 mm and more.

EXAMPLE 1 TREATMENT OF POLYSILICON SOLAR CELLS

Treatment of polycrystalline solar cells at a substrate temperature of 380° C. with the neutral species flux/active atomic particle flow source of the present invention improved the cell conversion efficiency $\eta$ up to 47% from its initial values. Polysilicon solar cells having up to 225 square centimeters of surface area and an initial conversion efficiency of 8.5%, thus can be hydrogenated (hydrogen passivated) to achieve a conversion efficiency $\eta$ of 12.5%. See Pakhomov et al., "Atomic Hydrogen Modification of Polycrystalline Silicon Solar Cells Characteristics" *Solid State Communications*, 1990, 76, pp. 887-890. Temperatures higher or lower than 38020 C also were used and it was noted that the improvement in conversion efficiency for such temperatures was less pronounced.

EXAMPLE 2 TREATMENT OF IbSb

Following hydrogenation of the neutral species source of the present invention, the characteristics of InSb MIS-capacitors were markedly improved. In particular, the concentrations of electron traps in the oxide/semiconductor interface and bulk recombination traps at $E_c - 0.1$ eV ($E_c$ is a conduction band edge position) were drastically diminished. Generation lifetimes in the structures gained up to one order of magnitude. (See also the details reported in Polyakov et al., "The Effect of Hydrogen on Bulk and Surface Traps in Indium Antimonide", *Solid State Communications*, 1990, 74, pp. 711-715.)

EXAMPLE 3 TREATMENT OF $Al_xGa_{1-x}As$

Strong passivation of deep centers (basically DX-centers) was observed after hydrogenation of multiquantum well (MQW) structures. MQW-related photoluminescence intensity rose up to 10 times. Moreover, the photoluminescence of structures with different Qw-quality became actually the same. Hence, the source of the present invention is useful in correcting the faults of a technological process for manufacturing such structures. See also the details reported in Polyakov et al., "Atomic Hydrogen Passivation of Deep Levels Activity In $Al_xGa_{1-x}As$ Multiquantum Well Structures", *Solid State Communications*, 1990, 76, pp. 761-763.

EXAMPLE 4 TREATMENT OF GaAs, InP SCHOTTKY DIODES

Dramatic improvements of current-voltage characteristics were manifested in the decrease of reverse currents (up to 10 times for InP and $10^2$ to $10^3$ times for GaAs) as well as in the drop of interface states densities in units treated at about 400° C. Au/n-GaAs, Au/n-InP Schottky diodes. The thin (about 80 nm) golden Schottky barriers successfully survived the treatments.

If the passivation particle flow is $2 \times 10^{20}$ s$^{-1}$, corresponding to a flow density at the substrate surface of $2 \times 10^{17}$ cm$^{-2}$sec$^{-1}$, the working gas consumption will be approximately:

$$(2 \times 10^{20})(1.7 \times 10^{-24}) = 3.4 \times 10^{-4} \text{ gs}^{-1}.$$

Regarding the power supply needed for the present invention, the consumed UHF-power is proportional to energy losses in the system per unit of time. The losses are basically caused by the losses on the walls of the plasma forming chambers, and the losses via plasma flow leaving the plasma discharge chambers. Assuming that energy losses (particles losses) in the direction perpendicular to magnetic field lines are substantially lower than the losses in the direction parallel to the magnetic field lines, and plasma parameters (concentration and temperature of electrons and ions) are similar to parameters of a known source, it can be assumed that the UHF-power is proportional to the cross-section of the plasma flow.

The smooth regulation of generator powers in the range of 0.1 to 1.0 kW, preferably 0.2 to 0.5 kW, when two separate generators are used is desired. A step regulation with 50 W steps is acceptable.

Optimization of various operating parameters for plasma, magnetic fields, and pressures provided an atomic hydrogen flow (x) of $3 \times 10^{18}$ atoms $s^{-3}cm^{-2}$. These conditions included plasma parameters of an electron temperature of plasma ($T_e$) of 20 eV, a plasma density of $1 \times 10^{12}$ cm$^{-3}$, which was high enough for total dissociation when the hydrogen molecule is passing through the plasma beam, and low enough for minimizing hydrogen flow scattering and recharging, and a plasma beam diameter of 4 cm. Alternate optimal plasma parameters were $T_e$ of 20 eV, a plasma density of $1 \times 10^{12}$ cm$^{-3}$, and a plasma beam diameter of 5 cm.

The time of passage of a hydrogen molecule through the plasma was determined to be on the order of $(5 \times 10^{-6}s) \times$(plasma diameter). Other preferred ranges of the plasma parameters are plasma density of from $10^{11}$ to $10^{13}$ cm$^{-3}$, a $T_e$ of 20 to 30 eV, a background pressure of hydrogen working gas of less than $7 \times 10^{-3}$ Torr, and a plasma diameter of 5 to 10 cm.

Regarding the magnetic field, the Larmor radius of ions $R_i$ must be lower than the distance D between the plasma boundary and the substrate surface. For $R_i = 2$ mm and $D \geq 30$ mm (preferably $D \geq 30$ cm), ion bombardment of the substrate was essentially eliminated.

Regarding the operating pressure, it should be low enough to eliminate scattering of hydrogen flow on the molecules of residual gases. The lower limit of operating pressure is defined by conditions of plasma formation. The operating pressure selected was $4 \times 10^{-4}$ Torr. As a result of these conditions, it was found that the active particles will move at least 34 cm from the plasma beam to the substrate without any collisions. This provides for an active particles flow distance of at least 40 cm.

Advantageously, the present invention provides an effective system for use in hydrogen passivation of semiconductor materials and devices. It can be used to solve such technological problems as passivation of detrimental deep levels (impurities, intrinsic defects) electrical and optical activity, suppression of interface states density, dangling bonds, dislocations and even two-and three-dimensioned defects deactivation in many, if not all, known crystalline semiconductors.

In particular, the present invention can be used for improving the characteristics of GaAs field effect transistors with the Schottky diode gate. When these transistors are treated with hydrogen at temperatures 380°–450° C., and then annealed in molecular hydrogen at 400°–450° C., the result is a decrease in concentration of deep centers in the channel, in the buffer layer (if the transistor is produced by epitaxy) and in the semi-insulating GaAs substrate. The annealing procedure can involve placing hydrogen treated samples on a sample holder (made, e.g., of quartz, graphite or high purity silicon) in a quartz tube through which a molecular hydrogen flow is passed (to prevent oxidation). The samples can be heated to a necessary temperature of 400°–450° C. by a wire heater wound around the quartz tube. Alternately, the samples can be annealed in a rapid thermal annealing (RTA) device where they are placed inside a chamber flushed with a forming gas mixture of hydrogen and argon and heated to the appropriate temperature by intense white light in a conventional manner, e.g., as in the formation of ohmic contacts. The beneficial effects are: (a) the suppression of parasitic photosensitivity of transistors caused by charging of deep centers in the buffer layer and substrate; (b) the diminishing of cross-talk between the devices that is due to excess substrate conductivity because of the presence of deep centers; (c) the decrease of low frequency noise and long-term drift of pammeters due to deep centers in the channel and the substrate. The temperature of hydrogen treatment and subsequent anneal are chosen so as to eliminate electrical activity of deep centers, preserving electrical activity of the shallow donors in the channel of the device.

The range of possible applications of present invention is not, however, limited by the present examples or to hydrogen passivation. The present invention also is applicable, for example, to the generation and transport to a substrate surface of an atomic species that is substantially free from an aggressive ionic component. Such atomic species are used in processes such as surface nitridization and oxidation.

One skilled in the art will appreciate that the present invention can be practiced by other than the described embodiments which are presented for purposes of illustration and not of limitation.

We claim:

1. A method for providing a flux of dissociated and excited molecules comprising:
   providing a first resonant cavity and a second resonant cavity;
   providing a first plasma discharge chamber in the first resonant cavity and a second plasma discharge chamber in the second resonant cavity;
   providing a reaction chamber connected between the first and second plasma discharge chambers, the reaction chamber having a gas flow path including an inlet for a working gas and an outlet for dissociated and excited molecules;
   evacuating the first and second discharge chambers and the reaction chamber and filling the first and second discharge chambers with a plasma supporting gas having a background pressure of less than $10^{-3}$ Torr;
   subjecting the first and second discharge chambers and the reaction chamber to a net magnetic field profile and propagating energy into the first and second resonant cavities at a frequency to ignite a plasma in the first and second discharge chambers at or near electron cyclotron resonance (ECR) conditions;
   producing first and second plasma streams from the first and second plasma discharge chambers;
   combining the first and second plasma streams in the reaction chamber and confining the combined plasma stream in the reaction chamber by the net magnetic field profile;

passing a working gas flow through the confined plasma to form neutral species of dissociated and excited molecules and charged species of electrons and ions; and confining the formed charged species to the reaction chamber by said net magnetic field so that the neutral species will flow out the outlet.

2. The method of claim 1 wherein providing the net magnetic field comprises stabilizing the combined plasma and minimizing the loss of charged particles by contact with the reaction chamber by using a multipole magnetic field proximate to the reaction chamber.

3. The method of claim 1 wherein providing the net magnetic field comprises providing a magnetic field in the resonant cavities at or near the ECR value for the frequency creating a magnetic mirror trap field in the reaction chamber, and directing a portion of the plasma discharge in each plasma discharge chamber toward the reaction chamber.

4. The method of claim 1 further comprising adjusting the net magnetic field profile between a first profile for igniting a plasma discharge in the first and second plasma discharge chambers and a second profile for maintaining a plasma discharge in the first and second plasma discharge chambers following ignition.

5. The method of claim 4 wherein providing the net magnetic field further comprises creating a magnetic mirror trap field in the reaction chamber, and directing a portion of the plasma discharge in each plasma discharge chamber towards the reaction chamber, wherein adjusting the net magnetic field profile further comprises varying the magnetic field in each resonant cavity around the ECR value.

6. The method of claim 4 wherein the net magnetic field profile comprises stabilizing the combined plasma and minimizing the loss of charged particles by contact with the reaction chamber by using a multipole magnetic field proximate to the reaction chamber.

7. The method of claim 6 wherein using a multipole magnetic field further comprises providing a plurality of magnetic elements spaced around the reaction chamber.

8. The method of claim 5 wherein the net magnetic field profile further comprises stabilizing the combined plasma and minimizing the loss of charged particles by contact with the reaction chamber by using a multipole magnetic field proximate to the reaction chamber.

9. The method of claim 8 wherein using a multipole magnetic field further comprises providing a plurality of magnetic elements spaced around the reaction chamber.

10. The method of claim 1 wherein propagating energy into the first and second resonant cavities further comprises propagating from between 0.1 and 0.5 kW into each of the first and second cavities.

11. The method of claim 1 wherein the combined plasma stream in the gas flow path has a diameter of between 3.3 and 10 cm.

12. The method of claim 11 wherein the combined plasma stream in the gas flow path has a density of between $10^{11}$ and $10^{13}$ cm$^{-3}$.

13. The method of claim 1 further comprising exposing a substrate to the neutral species flow for altering the characteristics of the substrate.

14. The method of claim 2 further comprising exposing a substrate to the neutral species flow for altering characteristics of the substrate.

15. The method of claim 3 further comprising exposing a substrate to the neutral species flow for altering characteristics of the substrate.

16. The method of claim 4 further comprising exposing a substrate to the neutral species flow for altering characteristics of the substrate.

17. The method of claim 9 further comprising exposing a substrate to the neutral species flow for altering characteristics of the substrate.

18. The method of claim 11 further comprising exposing a substrate to the neutral species flow for altering characteristics of the substrate.

19. The method of claim 1 further comprising controlling the pressure of the first and second discharge chambers and the reaction chamber to control the neutral species flow.

20. The method of claim 1 wherein the evacuating step further comprises evacuating the reaction chamber to a pressure in the range of between $10^{-2}$ and $10^{-5}$ Torr.

21. The method of claim 13 wherein the evacuating step further comprises evacuating the reaction chamber to pressure in the range between $10^{-2}$ and $10^{-5}$ Torr and evacuating the pressure at the substrate to a pressure in the range between $10^{-5}$ and $10^{-7}$ Torr.

22. The method of claim 14 wherein the evacuating step further comprises evacuating the reaction chamber to pressure in the range between $10^{-2}$ and $10^{-5}$ Torr and evacuating the pressure at the substrate to a pressure in the range between $10^{-5}$ and $10^{-7}$ Torr.

23. The method of claim 15 wherein the evacuating step further comprises evacuating the reaction chamber to pressure in the range between $10^{-2}$ and $10^{-5}$ Torr and evacuating the pressure at the substrate to a pressure in the range between $10^{-5}$ and $10^{-7}$ Torr.

24. The method of claim 16 wherein the evacuating step further comprises evacuating the reaction chamber to pressure in the range between $10^{-2}$ and $10^{-5}$ Torr and evacuating the pressure at the substrate to a pressure in the range between $10^{-5}$ and $10^{-7}$ Torr.

25. The method of claim 17 wherein the evacuating step further comprises evacuating the reaction chamber to pressure in the range between $10^{-2}$ and $10^{-5}$ Torr and evacuating the pressure at the substrate to a pressure in the range between $10^{-5}$ and $10^{-7}$ Torr.

26. The method of claim 18 wherein the evacuating step further comprises evacuating the reaction chamber to pressure in the range between $10^{-2}$ and $10^{-5}$ Torr and evacuating the pressure at the substrate to a pressure in the range between $10^{-5}$ and $10^{-7}$ Torr.

27. The method of claim 1 further comprising controlling the energy propagated into the first and second resonant cavity to control the neutral species flow.

28. A method for providing a neutral species flow including dissociated and excited molecules of a working gas comprising the steps of:

providing a resonant cavity and a reaction chamber in vacuum communication, the reaction chamber having a first aperture and a second aperture defining a gas flow path therethrough;

igniting a plasma in the resonant cavity;

confining a portion of the plasma in the reaction chamber by a first magnetic field;

stabilizing the confined plasma by a second magnetic field;

injecting a working gas in the first aperture so that the working gas intersects the confined plasma and forms neutral species and a charged species;

confining the charged species in the plasma by at least one of the first and second magnetic fields; and passing the neutral species out of the reaction chamber through the second aperture.

29. The method of claim 28 wherein the resonant cavity is an electron cyclotron resonance (ECR) plasma source further comprising adjusting the magnetic devices for varying the magnetic field strength inside the resonant cavity about the ECR value for the operating frequency.

* * * * *

UNITED STATES PATENT AND TRADEMARK OFFICE
CERTIFICATE OF CORRECTION

PATENT NO. : 5,336,533
DATED : August 9, 1994
INVENTOR(S) : Balmashnov, et. al.

It is certified that error appears in the above-indentified patent and that said Letters Patent is hereby corrected as shown below:

Col. 5, line 14, "{B{" should be -- |B| --.

Col. 7, line 18, "110 35" should be -- 110 --.

Col. 7, line 60, "elements-is" should be -- elements is --.

Col. 9, line 26 "$\Sigma$" should be -- $\chi$ --.

Col. 12, line 26, "IbSb" should be -- InSb --.

Signed and Sealed this

Twentieth Day of June, 1995

Attest:

BRUCE LEHMAN

Attesting Officer

Commissioner of Patents and Trademarks